United States Patent
Katsuki et al.

(10) Patent No.: US 6,979,497 B2
(45) Date of Patent: Dec. 27, 2005

(54) ELECTRO-CONDUCTIVE METAL PLATED POLYIMIDE SUBSTRATE

(75) Inventors: Shozo Katsuki, Yamaguchi (JP); Hidenori Mii, Yamaguchi (JP)

(73) Assignee: UBE Industries, Ltd., Yamaguchi (JP)

( * ) Notice: Subject to any disclaimer, the term of this patent is extended or adjusted under 35 U.S.C. 154(b) by 0 days.

(21) Appl. No.: 10/715,506

(22) Filed: Nov. 19, 2003

(65) Prior Publication Data
US 2004/0110024 A1    Jun. 10, 2004

(30) Foreign Application Priority Data
Nov. 19, 2002  (JP) ............... 2002-334914

(51) Int. Cl.[7] .................. B21D 39/00; B32B 15/00
(52) U.S. Cl. ............... 428/621; 428/458; 428/655
(58) Field of Search ................. 428/209, 458, 428/901

(56) References Cited

U.S. PATENT DOCUMENTS

| | | | | |
|---|---|---|---|---|
| 5,741,598 | A * | 4/1998 | Shiotani et al. | 428/458 |
| 6,129,982 | A * | 10/2000 | Yamaguchi et al. | 428/336 |
| 6,245,432 | B1 * | 6/2001 | Funada et al. | 428/458 |
| 6,379,784 | B1 * | 4/2002 | Yamamoto et al. | 428/216 |
| 6,548,180 | B2 * | 4/2003 | Yamamoto et al. | 428/473.5 |
| 6,596,968 | B2 * | 7/2003 | Yamamoto et al. | 219/121.71 |

* cited by examiner

*Primary Examiner*—Cathy F. Lam
(74) *Attorney, Agent, or Firm*—Nixon Peabody LLP; Jeffrey L. Costellia

(57) ABSTRACT

An electro-conductive metal plated polyimide substrate is composed of an aromatic polyimide substrate, a subbing metal layer of Mo—Ni alloy (in which a weight ratio of Mo to Ni is 75/25 to 99/1, and a plated electro-conductive film.

9 Claims, No Drawings

ELECTRO-CONDUCTIVE METAL PLATED POLYIMIDE SUBSTRATE

FIELD OF THE INVENTION

This invention relates to an electro-conductive metal plated polyimide substrate having a polyimide film and an electro-conductive metal film in which the electro-conductive metal film is attached to the polyimide film using neither heat curing adhesive nor thermoplastic adhesive. The electro-conductive metal plated polyimide substrate, typically a copper-clad laminate, of the invention is favorably employable for manufacturing particularly a TAB tape or a flexible printed circuit board (FPC).

BACKGROUND OF THE INVENTION

Heretofore, the TAB tape and flexible printed circuit board generally have been manufactured by combining a polyimide film with a copper foil using a heat-curing adhesive or a thermoplastic adhesive. Most of the known adhesives are heat resistant only up to a temperature of 200° C. Hence, it cannot be employed in a manufacturing process in which a high temperature procedure such as soldering is involved. Moreover, these adhesives are not satisfactory in their electric performances.

Accordingly, it is desired to provide a copper-clad laminate comprising a polyimide film and a copper film and showing increased heat resistance as a whole. Moreover, there is an additional problem in that a sufficiently thin copper film cannot be placed on the polyimide film by the conventional manufacturing method employing a copper foil and an adhesive. As a result, it becomes difficult to form a fine copper pattern on the polyimide film by etching.

Recently, copper-clad laminates using no adhesive have been proposed. However, it is difficult to manufacture a copper-clad laminate having a high bonding strength (namely, a high peel strength) between the polyimide film and the copper foil, because the polyimide film has a surface of poor adhesiveness. Therefore, a number of trials for improving the adhesiveness of the polyimide film surface have been made. For instance, wet treatment processes such as desmear treatment and an alkali treatment have been known. The wet treatment process is, however, disadvantageous in that a sufficient washing procedure should be done and further a sufficient drying procedure should be done before a copper foil is placed on the wet treated surface. Also known are dry surface treatments such as a plasma discharge treatment and a corona discharge treatment. However, the known dry surface treatments cannot impart to the polyimide film a sufficiently high adhesiveness to the copper foil.

JP-A-6-124,978 discloses a copper-clad laminate which is prepared by coating a polyimide film (prepared from a biphenyltetracarboxylic dianhydride and p-phenylenediamine) with a polyimide (PMDA polyimide, prepared from pyromellitic dianhydride and 4,4'-diaminodiphenyl ether), heating the coated product to give an intermediate PMDA polyimide layer, and placing a metal-deposited layer (such as Cr-deposited layer) and a plated copper layer on the intermediate layer.

JP-A-7-197239 describes a polyimide substrate comprising an aromatic polyimide film, a sputtered subbing metal layer, and an extremely thin copper layer. The subbing metal layer comprises a metal selected from the group of Ni, Cr, Mo, W, V, Ti, and Mn. The copper layer has a thickness of not more than 50 nm.

JP-A-8-332697 describes a polyimide substrate comprising an aromatic polyimide film, a subbing metal alloy layer, and a copper layer. The metal alloy layer comprises an alloy of metals selected from the group of Ti, Co, Mo, and Ni. In the working examples, the metal alloy layer comprises a metal alloy in which Mo is less than 50 wt. %.

When the electro-conductive metal plated polyimide substrate is employed for manufacturing electronic parts such as TAB tape or flexible printed circuit board, the polyimide substrate is subjected to a procedure for washing a resist pattern out of the electro-conductive surface metal layer using an aqueous alkaline solution, and further to an etching procedure using a etching solution such as an alkaline ferric chloride solution or an alkaline cupric chloride solution. In the former washing procedure, the surface metal layer and the subbing metal layer should be resistant to erosion by the alkaline solution. In the latter etching procedure, not only the surface metal layer but also the subbing metal layer should be etched out as quickly as possible.

SUMMARY OF THE INVENTION

The present inventors have noted that when the subbing metal layer is made of molybdenum, the molybdenum is too easily removed from the subbing layer in the procedure for washing a resist pattern out of the electro-conductive surface metal layer using an aqueous alkaline solution. The inventors further noted that if the subbing metal layer is made of Ni—Cr alloy, the subbing Ni—Cr alloy layer is resistant to the etching solution and cannot be smoothly etched out when the surface electro-conductive metal layer is etched out for producing the desired circuit pattern.

Accordingly, the present invention has an object to provide an electro-conductive metal plated polyimide substrate in which the subbing metal layer is resistant to treatment with an aqueous alkaline solution but is readily etched out by the etching solution when the surface electro-conductive metal layer is etched out for producing the desired circuit pattern.

The present invention resides in an electro-conductive metal plated polyimide substrate comprising an aromatic polyimide substrate, a subbing metal layer of Mo—Ni alloy comprising molybdenum and nickel in a weight ratio of 75/25 to 99/1, and a plated electro-conductive film.

Preferred embodiments of the invention are described below.

(1) The subbing metal layer of Mo—Ni alloy comprises molybdenum and nickel in a weight ratio of 75/25 to 95/5.

(2) The electro-conductive metal comprises copper.

(3) The aromatic polyimide substrate has a surface having been subjected to plasma treatment under reduced pressure, said surface being in contact with the subbing metal layer.

(4) The surface of the aromatic polyimide substrate has a protrusions dispersed to form a network of protrusions.

(5) The aromatic polyimide substrate comprises a biphenyltetracarboxylic acid component and a phenylenediamine component.

(6) The aromatic polyimide film comprises a high heat resistant aromatic polyimide core layer comprising a biphenyltetracarboxylic acid component and a phenylene diamine component, and a pair of flexible aromatic polyimide surface layers comprising polyimide having a flexible bonding in a molecular structure thereof.

(7) The subbing metal layer of Mo—Ni alloy has a thickness in the range of 2 to 30 nm.

(8) The electro-conductive film has a thickness in the range of 0.05 to 30 $\mu$m.

(9) A sputtered copper metal layer is provided between the subbing metal layer and the plated electro-conductive metal film.

(10) The plated polyimide substrate does not show any change of appearance when it is placed in an alkaline etching solution containing 2 wt. % of NaOH for 5 min., at 50° C.

(11) The polyimide substrate keeps a surface insulation resistance of $4 \times 10^{10} \Omega$ or higher in either case that it is placed in a ferric chloride solution or a cupric chloride solution.

DETAILED DESCRIPTION OF THE INVENTION

In the invention, the polyimide film preferably is a multi-layered polyimide film which comprises a highly resistant aromatic polyimide core (i.e., inner) layer comprising polyimide prepared from a biphenyltetracarboxylic acid compound and one or two flexible polyimide surface (i.e., outer) layers comprising polyimide having a bendable bonding in a main chain of its molecular structure. The multi-layered polyimide film is preferably subjected to plasma discharge treatment under reduced pressure to form fine protrusions connected to form a network of protrusions.

Otherwise, the polyimide film is a single layer which comprises polyimide prepared from a combination of a polyamic acid compound (comprising a biphenyltetracarboxylic acid component) and a polyamic acid compound (comprising a tetracarboxylic acid component having a bendable bonding in a main chain of its molecular structure or a blended polyimide).

The multi-layered polyimide film is preferably prepared by an extrusion process which is performed by the following method.

A polyamic acid solution containing a polyamic acid derived from a biphenyltetracarboxylic acid compound and a polyamic acid solution containing a polyamic acid having a bendable bonding in the main chain are separately extruded, and subsequently placing one on another to form a multi-layered solution product. Each of the polyamic acid solutions preferably has a viscosity of 500 to 5,000 poises. The multi-layered solution product is dried at a temperature of 80 to 200° C., and then cured at a temperature of not lower than 300° C., preferably 300 to 550° C. Thus, the desired multi-layer polyimide film is prepared.

The highly heat resistant polyimide is preferably prepared from not less than 10 mol % (preferably not less than 15 mol %) of a biphenyltetracarboxylic acid compound and not less than 5 mol % (preferably not less than 15 mol %) of p-phenylene diamine, because the resulting polyimide has high heat resistant, high mechanical strength, and high dimensional stability. Other aromatic tetracarboxylic acid compounds such as pyromellitic dianhydride and/or other aromatic diamines such as 4,4-diaminodiphenyl ether can be employed in combination with the biphenyltetracarboxylic acid compound and p-phenylene diamine.

The polyamic acid solutions can be prepared in an organic polar solvent such as an amide solvent (e.g., N,N-dimethylformamide, N,N-dimethylacetamide, N-methyl-2-pyrrolidone, and N-methylcaprolactam), dimethylsulfoxide, hexamethylphosphoramide, dimethylsulfone, tetramethylenesulfone, dimethyltetramethylenesulfone, pyridine, or ethylene glycol.

The aromatic polyimide having a bendable bonding in the main chain of its molecular structure is preferably prepared from an aromatic tetracarboxylic dianhydride having the formula (1):

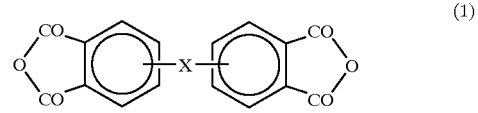

[X is O, CO, S, SO$_2$, CH$_2$, or C(CH$_3$)$_2$] and/or an aromatic diamine compound having the formula (2):

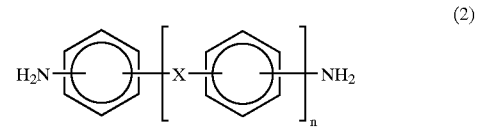

[X is O, Co, S, SO$_2$, CH$_2$, or C(CH$_3$)$_2$, and n is an integer of 0 to 4, preferaby 1 to 4].

In the preparation of the aromatic polyimide having a bendable bonding in the main chain of its molecular structure, other tetracarboxylic acid compounds and/or aromatic amines can be employed in combination.

Examples of the aromatic tetracarboxylic acid compounds having the formula (1) includes aromatic tetracarboxylic acids, their acid anhydrides, their salts and their esters. Most preferred are their acid dianhyrides. Examples of the aromatic tetracarboxylic acids include 3,3',4,4'-benzophenonetetracarboxylic acid, 2,2-bis(3,4-dicarboxyphenyl)propane, bis(3,4-dicarboxyphenyl)methane, and bis(3,4-dicarboxyphenyl)ether. The aromatic tetracarboxylic acid compounds can be used singly or in combination.

In the case that the aromatic diamine compound having the formula (2) is employed as the diamine compound, the aromatic tetracarboxylic acid compounds can be one or more of a 3,3',4,4'-biphenyltetracarboxylic acid compound, a 2,3,3',4'-biphenyltetracarboxylic acid compound, a 2,3,4', 4'-biphenyltetracarboxylic acid compound, and a pyromellitic acid compound. These compounds can be used in combination with the compounds of the formula (1).

Examples of the aromatic diamine compounds having the formula (2) include diphenylether diamines such as 4,4'-diaminodiphenyl ether, 3,3'-diaminodiphenyl ether, benzophenone diamine, 3,3'-diaminobenzophenone, and 4,4'-diaminobenzophenone; diaminodiphenyl alkane diamines such as 3,3'-diaminodiphenylmethane, 4,4'-diaminodiphenylmethane, and 1,3-bis(3-aminophenoxy)benzene; and 4,4'-bis( 3-aminophenoxy)biphenyl. These diamine compounds can be employed singly or in combination.

In the case that the compound of the formula (1) is employed as the aromatic tetracarboxylic compound, the diamine compound can be 1,4-diaminobenzene (i.e., p-phenylene diamine), or a benzidine compound such as benzidine or 3,3'-dimethylbenzidine. These diamine compounds can be used singly or in combination. These diamine compounds can be used in combination with the diamine compound of the formula (2).

The extruded multi-layered film preferably has a total thickness of 7 to 100 μm, more preferably 7 to 50 μm. In the multi-layered film, the surface polyimide layer preferably has a thickness of 0.1 to 10 μm, more preferably 0.2 to 5 μm.

The polyimide film employed in the invention preferably has fine protrusions dispersed on the surface and possibly connected to form a network. The protrusions dispersed to form a network can be produced on the polyimide film by subjecting the polyimide film to plasma discharge treatment under reduced pressure such as vacuum discharge treatment. The reduced pressure plasma discharge treatment can be performed in the presence of a gas such as He, Ne, Ar, Kr, Xe, $N_2$, $CF_4$ or $O_2$. The gas can be used singly or in combination. The pressure preferably is 0.3 to 50 Pa, more preferably 0.3 to 30 Pa. The temperature can be in the range of −20 to 20° C. The polyimide film having the fine protrusions in the form of a network generally has a surface roughness (Ra: mean roughness) in the range of 0.03 to 0.1 μm, preferably 0.04 to 0.08 μm. The polyimide film having been subjected to the reduced pressure plasma discharge treatment can be then (namely, successively or after it is once placed under atmospheric conditions) cleaned by a plasma cleaning procedure On the surface of the polyimide film having the fine protrusions, a subbing thin Mo—Ni alloy layer (and further an upper thin copper layer) are preferably deposited by vacuum deposition or sputtering. The vacuum deposition can be carried out at a pressure of $10^{-5}$ to 1 Pa, and a deposition rate of 5 to 500 nm/sec. The sputtering is preferably carried out by the DC magnet sputtering at a pressure of 0.1 to 1 Pa and a layer deposition rate of 0.05 to 50 nm/sec. The finally deposited layer generally has a thickness of 10 nm to 1 μm and preferably has a thickness of 0.1 to 0.5 μm. The polyimide film can be so processed as to have bores (e.g., through-holes and via-holes) by laser processing, mechanical processing, or wet processing.

The metal-deposited upper thin copper layer (or an intermediate layer) can be a single layer or plural layers, and preferably comprises copper or copper-containing alloy. On the deposited two or more metal layers (the subbing Mo—Ni alloy layer and one or more intermediate copper layers), a copper film is placed by electrolytic plating (i.e., electroplating). The copper film preferably has a thickness of approximately 2 to 30 μm. A non-electrolytic plating can be employed in combination with the electrolytic plating. The non-electrolytic plating is advantageously employed in the case that the metal deposited layers have pin holes. The copper film preferably comprises copper or a copper alloy.

The metal deposition and copper plating can be made on one surface or both surfaces of the polyimide film. If the metal deposition and copper plating is made on one surface, the other surface can have a heat-conductive metal or ceramic material layer.

The invention is further described by the following examples.

In the following examples, the physical and chemical characteristics were determined by the methods described below:

Appearance of film surface: observed by taking a SEM photograph (×50,000) for confirming if fine protrusions forming a network are produced.

Film thickness: The sections of the polyimide core layer and surface layer are measured by means of optical microscope.

EXAMPLE 1

An aromatic polyamic acid solution (concentration: 18%, rotary viscosity: 1,600 poises, Polyamic acid solution A for high heat-resistant polyimide) prepared by reacting p-phenylene diamine and 3,3',4,4'-biphenyltetracarboxylic dianhydride in N,N-dimethylacetamide, and an aromatic polyamic acid solution (concentration: 18%, rotary viscosity: 1,500 poises, Polyamic acid solution B for flexible polyimide) prepared by reacting 4,4'-diaminodiphenyl ether and 3,3',4,4'-biphenyltetracarboxylic dianhydride in N,N-dimethylacetamide were simultaneously extruded separately and immediately spread together on a metal support, and continuously dried by applying air heated to 140° C. The resulting solid film (i.e., self-supporting film, a volatile substance content: 36 wt. %) was peeled from the support and heated gradually from 200° C. to 450° C., to produce a continuous three-layered polyimide film comprising a flexible polyimide surface layer (3 μm), a high heat resistant polyimide core layer (32 μm), and a flexible polyimide surface layer (3 μm).

The resulting three-layered polyimide film had a tensile modulus (MD) of 7.48 GPa, a linear expansion coefficient (50 to 200° C.) of 16.6 ppm, and a heat shrinkage coefficient (200° C.×2 hrs.) of not higher than 0.1%.

The three-layered polyimide film was subjected to the following surface treatments, and then covered with plural metal films.

1) Treatment-1: Etching by Vacuum Plasma Treatment

The polyimide film is placed in a vacuum plasma treating apparatus. The apparatus is evacuated to reach a pressure of lower than 0.1 Pa (inner pressure) and then charged with Ar gas (Ar=100%). Subsequently, the vacuum plasma treatment is carried out at a pressure of 13.3 Pa and a power of 5 KW (40 KHz) for 2 min.

2) Treatment-2: Formation of Subbing Layer and Intermediate Layer

The etched polyimide film is placed in a DC sputtering apparatus. The apparatus is evacuated to reach an inner pressure of lower than $2 \times 10^{-4}$ Pa and then charged with Ar gas to reach an inner pressure of 0.67 Pa. Subsequently, the electrode attached placed in contact with the polyimide film is applied a high frequency electric power of 13.56 MHz at a power of 300 W for one minute.

On the polyimide film having been subjected to Treatment-2 is subsequently deposited 3 nm of Mo—Ni alloy layer by DC sputtering at 0.67 Pa in the presence of Ar gas. The Mo—Ni alloy target employed in the sputtering comprised Mo—Ni alloy of Mo/Ni=94.2/5.8, by weight. Subsequently, 300 nm of Cu thin film was formed on the Mo—Ni alloy layer by DC-sputtering under Ar atmosphere (0.67 Pa). Thus metal-deposited polyimide film is then placed under atmospheric conditions.

The metal-deposited polyimide film is then placed in an aqueous acidic plating solution to form a plated copper film of 5 μm thick under the following conditions:

Electric current: 1 $A/dm^2$ for min. and subsequently 4.5 $A/dm^2$ for 5 min.

Thus, there was prepared a copper film-plated polyimide film of the invention comprising an aromatic polyimide substrate film, a deposited subbing Mo—Ni alloy layer (Mo/Ni=94.2/5.8, weight ratio, thickness: 5 nm), a deposited copper layer (thickness: 300 nm), and an electrically plated copper film (thickness: 15 μm).

Evaluation

Measurement-1: Surface Insulation Resistance of Etched Surface

A photoresist was placed on the polyimide film having a subbing Mo—Ni layer on its surface which was prepared in Treatment-2 and treated to form a comb shaped electrode A pattern using an IPC test board pattern (IPC-B-25). The polyimide film having the comb shaped electrode A pattern was etched using an aqueous ferric chloride etching solution (at 40° C.) or an aqueous cupric chloride etching solution (at 28° C.). The photoresist remaining on the polyimide film was then removed by washing with acetone. The polyimide film having an electrode pattern was subjected to measurement of surface insulation resistance at 23° C., 40% RH.

Measurement-2: Rate for Etching Mo—Ni Alloy Layer and Copper Layer Out

A Mo—Ni alloy layer of 0.3 μm thick was deposited on the polyimide film in the same manner as that described in Treatment-2. The Mo—Ni alloy layer-deposited polyimide film was placed in an aqueous ferric chloride etching solution (at 40° C.) or an aqueous cupric chloride etching solution (at 28° C.) for etching the Mo—Ni alloy layer out. A time required to etch the Mo—Ni alloy layer out until exposing the surface of the polyimide layer was measured.

In the same manner, a copper layer of 0.3 μm thick was deposited on the polyimide film. The Cu metal layer-deposited polyimide was treated for etching out. A time required to etch the coppor layer out until exposing the surface of the polyimide layer was measured.

Separately, a copper layer of 7.7 μm thick was plated on the polyimide film. The Cu metal layer-plated polyimide was treated for etching out. A time required to etch the coppor layer out until exposing the surface of the polyimide layer was measured.

Thus, a rate of etching the subbing metal layer, and a ratio of etching rate (subbing Mo—Ni layer/surface Cu layer) or (subbing Cu layer/surface Cu layer were measured. The ratio of etching rate should be in the range of 0.01 to 20.

Measurement-3: Resistance to Alkaline Solution

A photoresist was placed on the polyimide substrate having the surface copper plated layer and is subjected to radiation to produce on the copper layer an exposed pattern (width 3 mm, length: 200 mm). The partly exposed polyimide substrate was placed in an aqueous NaOH solution (NaOH 2 wt. %) at 50° C., for 5 min., 10 min., or 20 min, for removing the remaining cured photoresist. At a lapse of time, the edge portion of the polyimide film became colored. The depth of colored edge was examined from the back side of the polyimide film.

The results of measurements and evaluations are set forth in Tables 1 to 4. The polyimide substrate of Example 1 was given a mark of excellent in total.

Further, it was confirmed that 90° peel strength (at 23° C.) of the plated copper layer from the polyimide substrate was 1.8 kgf/cm (satisfactory), and that the 90° peel strength after heat treatment at 150° C. for 168 hrs was 0.5 kgf (satisfactory).

EXAMPLE 2

The procedures of Example 1 were repeated to change the composition of Mo—Ni alloy layer to Mo/Ni=88.4/11.6 (by weight).

The results of measurements and evaluations are set forth in Tables 1 to 4. The polyimide substrate of Example 2 was given a mark of excellent in total.

Further, it was confirmed that 90° peel strength (at 23° C.) of the plated copper layer from the polyimide substrate was 1.8 kgf/cm (satisfactory), and that the 90° peel strength after heat treatment at 150° C. for 168 hrs was 0.5 kgf (satisfactory).

EXAMPLE 3

The procedures of Example 1 were repeated to change the composition of Mo—Ni alloy layer to Mo/Ni=76.6/23.4 (by weight).

The results of measurements and evaluations are set forth in Tables 1 to 4. The polyimide substrate of Example 3 was given a mark of excellent in total.

Further, it was confirmed that 90° peel strength (at 23° C.) of the plated copper layer from the polyimide substrate was 1.8 kgf/cm (satisfactory), and that the 900 peel strength after heat treatment at 150° C. for 168 hrs was 0.5 kgf (satisfactory).

EXAMPLE 4

The procedures of Example 1 were repeated to the three-layered polyimide film was replaced with the below-mentioned single layer polyimide film.

(Preparation of Single Layer Polyimide Film)

The Polyamic acid solution A was extruded and immediately spread on a metal support, and continuously dried by applying air heated to 140° C. The resulting solid film (i.e., self-supporting film, a volatile substance content: 36 wt. %) was peeled from the support and heated gradually from 200° C. to 450° C., to produce a continuous single layer polyimide film having a thickness of 25 μm.

The resulting single layer polyimide film had a tensile modulus (MD) of 9.4 GPa, a linear expansion coefficient (50 to 200° C.) of 11 ppm, and a heat shrinkage coefficient (200° C.×2 hrs.) of not higher than 0.1%.

The results of measurements and evaluations are set forth in Tables 1 to 4. The polyimide substrate of Example 4 was given a mark of excellent in total.

Further, it was confirmed that 90° peel strength (at 23° C.) of the plated copper layer from the polyimide substrate was 1.0 kgf/cm (satisfactory), and that the 90° peel strength after heat treatment at 150° C. for 168 hrs was 0.3 kgf (satisfactory).

EXAMPLE 5

The procedures of Example 4 were repeated to change the composition of Mo—Ni alloy layer to Mo/Ni=88.4/11.6 (by weight).

The results of measurements and evaluations are set forth in Tables 1 to 4. The polyimide substrate of Example 5 was given a mark of excellent in total.

Further, it was confirmed that 90° peel strength (at 23° C.) of the plated copper layer from the polyimide substrate was 1.0 kgf/cm (satisfactory), and that the 90° peel strength after heat treatment at 150° C. for 168 hrs was 0.3 kgf (satisfactory).

EXAMPLE 6

The procedures of Example 4 were repeated to change the composition of Mo—Ni alloy layer to Mo/Ni=76.6/23.4 (by weight).

The results of measurements and evaluations are set forth in Tables 1 to 4. The polyimide substrate of Example 6 was given a mark of excellent in total.

Further, it was confirmed that 90° peel strength (at 23° C.) of the plated copper layer from the polyimide substrate was 1.0 kgf/cm (satisfactory), and that the 90° peel strength after heat treatment at 150° C. for 168 hrs was 0.3 kgf (satisfactory).

COMPARISON EXAMPLE 1

The procedures of Example 1 were repeated to replace the Mo—Ni alloy layer with a Mo layer.

The results of measurements and evaluations are set forth in Tables 1 to 4. The polyimide substrate of Example 6 was given a mark of bad in total.

COMPARISON EXAMPLE 2

The procedures of Example 1 were repeated to replace the Mo—Ni alloy layer with a Cr—Ni ally layer (Cr/Ni=20/80, weight ratio).

The results of measurements and evaluations are set forth in Tables 1 to 4. The polyimide substrate of Example 6 was given a mark of bad in total.

COMPARISON EXAMPLE 3

The same procedure for forming a subbing layer of Mo/Ni=50/50 (weight ratio) on the polyimide film by sputtering was tried but failed due to magnetism of a Mo/Ni target.

TABLE 1

| | Surface insulation resistance | |
|---|---|---|
| Example | FeCl$_2$ solution ($\Omega$) | CuCl$_2$ solution ($\Omega$) |
| Example 1 | $1.8 \times 10^{12}$ - AA | $1.8 \times 10^{12}$ - AA |
| Example 2 | $1.8 \times 10^{12}$ - AA | $1.8 \times 10^{12}$ - AA |
| Example 3 | $1.7 \times 10^{12}$ - AA | $1.7 \times 10^{12}$ - AA |
| Example 4 | $1.8 \times 10^{12}$ - AA | $1.8 \times 10^{12}$ - AA |
| Example 5 | $1.8 \times 10^{12}$ - AA | $1.8 \times 10^{12}$ - AA |
| Example 6 | $1.7 \times 10^{12}$ - AA | $1.9 \times 10^{12}$ - AA |
| Com. Ex. 1 | $4.8 \times 10^{12}$ - AA | $4.1 \times 10^{10}$ - A |
| Com. Ex. 2 | $4.4 \times 10^{8}$ - C | $4.4 \times 10^{8}$ - C |

Remarks:
AA: excellent,
A: good,
B: acceptable,
C: bad

TABLE 2

| | Rate for etching subbing metal layer | |
|---|---|---|
| Example | FeCl$_2$ solution ($\mu$m/min.) | CuCl$_2$ solution ($\mu$m/min.) |
| Example 1 | 10.2 | 1.0 |
| Example 2 | 30.0 | 6.0 |
| Example 3 | 30.0 | 6.0 |
| Example 4 | 10.2 | 1.0 |
| Example 5 | 30.0 | 6.0 |
| Example 6 | 30.0 | 6.0 |
| Com. Ex. 1 | 3.6 | 0.2 |
| Com. Ex. 2 | 30.0 | 6.0 |

TABLE 3

| | Ratio of etching rate (subbing layer/upper layer) | |
|---|---|---|
| Example | FeCl$_2$ solution | CuCl$_2$ solution |
| Example 1 | 1.9 | 0.2 |
| Example 2 | 5.5 | 1.4 |
| Example 3 | 5.5 | 1.4 |
| Example 4 | 1.9 | 0.2 |
| Example 5 | 5.5 | 1.4 |
| Example 6 | 5.5 | 1.4 |
| Com. Ex. 1 | 0.7 | 0.05 |
| Com. Ex. 2 | 0.0 | 0.0 |

TABLE 4

| | Resistances to alkaline solution ($\mu$m) | | | |
|---|---|---|---|---|
| Example | 5 min. | 10 min. | 20 min. | Evaluation |
| Example 1 | 0 | 0 | 0 | AA |
| Example 2 | 0 | 0 | 0 | AA |
| Example 3 | 0 | 0 | 0 | AA |
| Example 4 | 0 | 0 | 0 | AA |
| Example 5 | 0 | 0 | 0 | AA |
| Example 6 | 0 | 0 | 0 | AA |
| Com. Ex. 1 | 52 | 76 | 135 | C |
| Com. Ex. 2 | 0 | 0 | 0 | AA |

What is claimed is:

1. An electro-conductive metal plated polyimide substrate comprising an aromatic polyimide substrate, a subbing metal layer of Mo—Ni alloy comprising molybdenum and nickel in a weight ratio of 75/25 to 95/5 formed over said substrate, and a plated electro-conductive metal film, formed over said subbing metal layer.

2. The electro-conductive metal plated polyimide substrate of claim 1, in which the electro-conductive metal film comprises copper.

3. The electro-conductive metal plated polyimide substrate of claim 1, in which the aromatic polyimide substrate has a surface having been subjected to plasma treatment under reduced pressure, said surface being in contact with the subbing metal layer.

4. The electro-conductive metal plated polyimide substrate of claim 1, in which the aromatic polyimide substrate comprises a biphenyltetracarboxylic acid component and a phenylenediamine component.

5. The electro-conductive metal plated polyimide substrate of claim 1, in which the aromatic polyimide substrate comprises a high heat resistant aromatic polyimide core layer comprising a biphenyltetracarboxylic acid component and a phenylene diamine component, and a pair of flexible aromatic polyimide surface layers comprising polyimide having a flexible bonding in a molecular structure thereof.

6. The electro-conductive metal plated polyimide substrate of claim 1, in which the subbing metal layer of Mo—Ni alloy has a thickness in the range of 2 to 30 nm.

7. The electro-conductive metal plated polyimide substrate of claim 1, in which the electro-conductive metal film has a thickness in the range of 0.05 to 30 $\mu$m.

8. The electro-conductive metal plated polyimide substrate of claim 1, in which a sputtered copper metal layer is provided between the subbing metal layer and the plated electro-conductive metal film.

9. The electro-conductive metal plated polyimide substrate of claim 1, which satisfies the following requirements:
said polyimide substrate does not show any change of appearance when it is placed in an alkaline etching solution containing 2 wt. % of NaOH for 5 min., at 50° C.; and
said polyimide substrate keeps a surface insulation resistance of $4 \times 10^{10} \Omega$ or higher in either case that it is placed in a ferric chloride solution or a cupric chloride solution.

* * * * *